United States Patent
Izumi

(10) Patent No.: US 7,407,880 B2
(45) Date of Patent: Aug. 5, 2008

(54) SEMICONDUCTOR DEVICE AND MANUFACTURING PROCESS THEREFORE

(75) Inventor: Katsuya Izumi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 432 days.

(21) Appl. No.: 11/002,307

(22) Filed: Dec. 3, 2004

(65) Prior Publication Data

US 2005/0124156 A1   Jun. 9, 2005

(30) Foreign Application Priority Data

Dec. 5, 2003   (JP) .............................. 2003-407000

(51) Int. Cl.
*H01L 21/8238*   (2006.01)
*H01L 29/94*   (2006.01)

(52) U.S. Cl. .................... 438/630; 438/283; 438/655; 438/682

(58) Field of Classification Search ................ None
See application file for complete search history.

(56) References Cited

U.S. PATENT DOCUMENTS 5,468,669 A * 11/1995 Lee et al. ................ 438/228
5,550,079 A    8/1996 Lin
6,214,656 B1 * 4/2001 Liaw ..................... 438/199
6,277,719 B1   8/2001 Chern et al.
6,593,631 B2 * 7/2003 Lee et al. ................ 257/369
6,670,680 B2 * 12/2003 Nohsoh et al. ............ 257/369
6,853,039 B2 * 2/2005 Tanaka ................... 257/369

FOREIGN PATENT DOCUMENTS

JP   2000-332210   11/2000
JP   2002-217310    2/2002

* cited by examiner

*Primary Examiner*—Zandra Smith
*Assistant Examiner*—Pamela E Perkins
(74) *Attorney, Agent, or Firm*—Young & Thompson

(57) ABSTRACT

A semiconductor device which can prevent a leak current between a silicide layer on a polysilicon and another part, as well as a manufacturing process therefor. The semiconductor device includes neighboring n- and p-type polysilicons; and a silicide layer thereon extending from the n-type polysilicon to the p-type polysilicon. The silicide layer is formed over the upper surfaces of the n- and p-type polysilicons except the periphery thereof.

20 Claims, 20 Drawing Sheets

SEMICONDUCTOR DEVICE AND MANUFACTURING PROCESS THEREFORE

This application is based on Japanese patent application NO. 2003-407000, the content of which is incorporated hereinto by reference.

BACKGROUND OF THE INVENTION

1. Field of the Invention

This invention relates to a semiconductor device and a manufacturing process therefor.

2. Description of the Related Art

A conventional cell unit in, for example, a DRAM memory cell comprises neighboring n- and p-type polysilicons and, for reducing a resistance between the n- and the p-type polysilicons, a silicide layer over the whole surface of the polysilicons (see, Japanese patent application NO. 2000-332210; FIG. 2).

SUMMARY OF THE INVENTION

However, when forming a silicide layer on a polysilicon as described in Japanese patent application NO. 2000-332210, a silicide layer 102 on a polysilicon 101 is close to a silicide layer 104 on a diffusion layer 103 as illustrated in FIG. 18. We have now discovered there may sometimes remains a mustache-like silicide between the silicide layers 102 and 104, in other words, on the side of the polysilicon 101. The mustache-like structure may cause a leak current between the silicide layer 102 on the polysilicon 101 and the diffusion layer 103.

According to an aspect of this invention, there is provided a semiconductor device comprising neighboring n- and p-type polysilicons and a silicide layer thereon extending from the n-type polysilicon to the p-type polysilicon, wherein the silicide layer is formed over the upper surfaces of the n- and p-type polysilicons except a periphery thereof.

A semiconductor device according to this invention comprises a silicide layer extending from the n-type polysilicon to the p-type polysilicon and the silicide layer is formed over the upper surfaces of the n- and p-type polysilicons except the periphery thereof. Thus, a leak current between the silicide layer and another part via a side of the polysilicon can be suitably prevented while reducing a resistance between the n- and p-type polysilicons by the silicide layer.

As used herein, "a silicide layer is formed over the upper surfaces of the n- and the p-type polysilicons except the periphery thereof" means that the silicide layer is formed within a region over which the n- and p-type polysilicons are deposited from the direction of the normal line to the upper surfaces of the n- and p-type polysilicons.

According to another aspect of this invention, there is provided a process for manufacturing a semiconductor device comprising forming neighboring n- and p-type polysilicons; and forming a silicide layer extending from the n-type polysilicon to the p-type polysilicon over the upper surfaces of the n- and the p-type polysilicons except a periphery thereof.

In the process for manufacturing a semiconductor device according to this invention, a silicide layer is formed, extending from the n-type polysilicon to the p-type polysilicon and the silicide layer is formed over the upper surfaces of the n- and the p-type polysilicons except the periphery thereof. Thus, a leak current between the silicide layer and another part via a side of the polysilicon can be suitably prevented while reducing a resistance between the n- and p-type polysilicons by the silicide layer.

In a semiconductor device according to this invention, the silicide layer may be formed only in a border and its neighboring area between the n- and the p-type polysilicons.

In the forming a silicide layer in a process for manufacturing a semiconductor device according to this invention, the silicide layer may be formed only in the border and its neighboring area between the n- and the p-type polysilicons.

As used herein, "a silicide layer is formed only in the border and its neighboring area between the n- and the p-type polysilicons" means that the silicide layer is formed such that it extends from the n-type polysilicon to the p-type polysilicon to a degree allowing a resistance between the polysilicons to be reduced. It may further ensure that a leak current via a side of the polysilicon is prevented.

Herein, in the n- and p-type polysilicons, a region on which the silicide layer is to be formed and its neighboring area may be broader than a surrounding area.

In the forming polysilicons in the process for manufacturing a semiconductor device according to this invention, the n- and p-type polysilicons may be formed such that a region on which the silicide layer is to be formed and its neighboring area is broader than a surrounding area.

Thus, the silicide layer may be more reliably formed.

A semiconductor device according to this invention may further comprise an interlayer insulating film over the silicide layer and the n- and the p-type polysilicons, where the interlayer insulating film have a first and a second contacts in the areas corresponding to the n- and the p-type polysilicons, respectively, each of which is connected to the silicide layer.

Alternatively, the process for manufacturing a semiconductor device according to this invention may further comprise forming an interlayer insulating film over the silicide layer and the n- and the p-type polysilicons; and forming in the interlayer insulating film a first and a second contacts corresponding to the n- and the p-type polysilicons, respectively, each of which is connected to the silicide layer.

Thus, the contacts may be connected to the n- and p-type polysilicons, respectively, via the silicide layer, so that a connection resistance in the bottom of the contact can be more reliably reduced. Herein, the interlayer insulating film may be formed in contact with the silicide layer and the contact may be made of a conducting member buried in the interlayer insulating film.

In a semiconductor device according to this invention, the n-type polysilicon may act as an n-gate while the p-type polysilicon may act as a p-gate. Thus, connecting the n-gate and the p-gate with a lower resistance, a leak current via the side of a gate electrode in a transistor can be prevented.

A semiconductor device according to this invention may comprise at least a DRAM, whose cell may comprise the n- and the p-gates and the silicide layer. Thus, a leak current via the side of a gate electrode in a transistor in the cell of the DRAM can be prevented.

Alternatively, the semiconductor device according to this invention may comprise at least a nonvolatile memory, whose cell may comprise the n- and the p-gates and the silicide layer. Thus, a leak current via the side of a gate electrode in a transistor in the cell of the nonvolatile memory can be prevented.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Embodiment 1

Figure 1A:
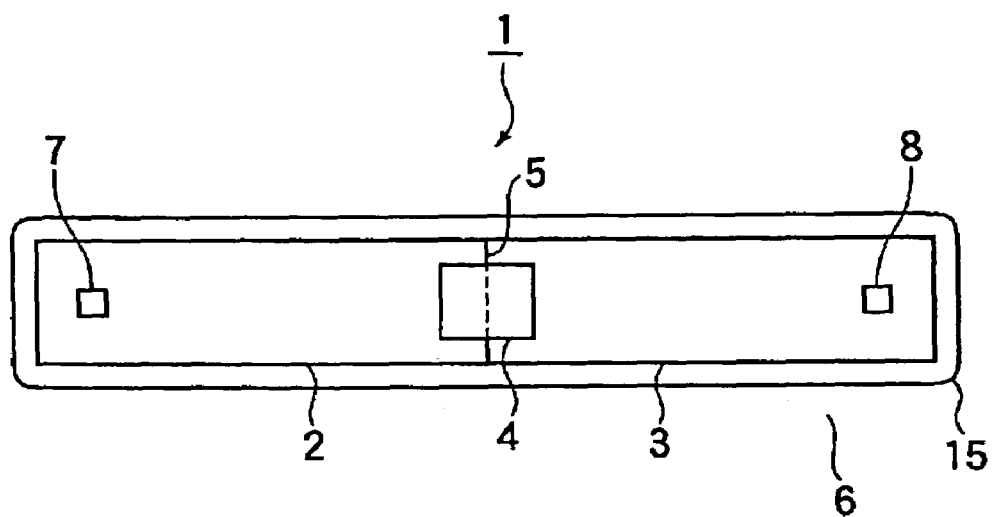
FIG. 1A is a schematic plan view showing a configuration of a semiconductor device according to the present embodiment.
Figure 1B:
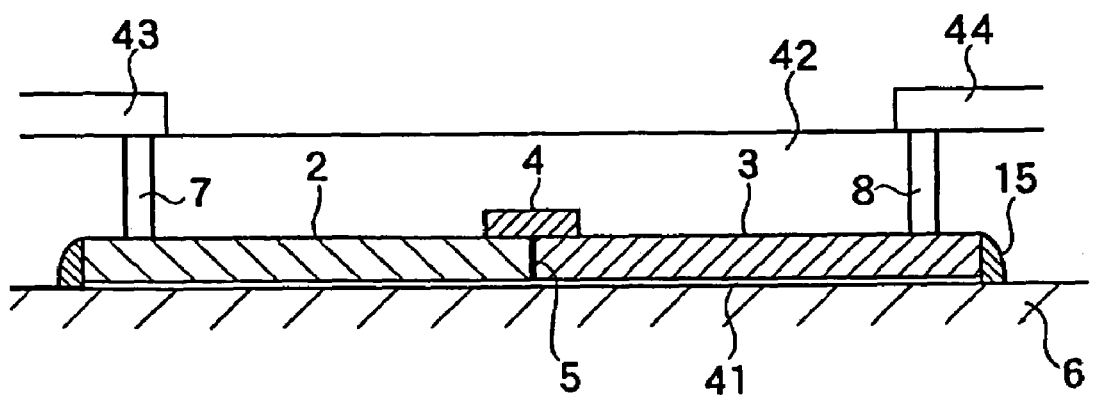
FIG. 1B is a schematic elevational view in section showing a configuration of a semiconductor device according to the present embodiment.

FIG. 1A is a schematic plan view showing a configuration of a semiconductor device according to Embodiment 1 of this invention and FIG. 1B is a schematic elevational view in section thereof. In FIG. 1A, an interlayer insulating film 42, a first interconnection layer 43 and a second interconnection layer 44 described later are not shown.

As shown in FIGS. 1A and 1B, a semiconductor device 1 according to Embodiment 1 comprises neighboring n- and p-type polysilicons 2,3 and a silicide layer (also known as a metal silicide layer) 4 thereon extending from the n-type polysilicon 2 to the p-type polysilicon 3, where the silicide layer 4 is formed only over the upper surfaces of the n- and p-type polysilicons 2,3 except the periphery thereof.

In other words, the silicide layer 4 is formed only in the inner areas in the n- and p-type polysilicons 2,3 except the periphery areas. Specifically, the silicide layer 4 is formed only over the middle part of the n- and p-type polysilicons 2,3.

Furthermore, the silicide layer 4 is, for example, formed only in a border 5 and its neighboring area between the n- and p-type polysilicons 2,3.

The n- and p-type polysilicons 2,3 are, for example, formed on a lower base film (for example, a semiconductor substrate) 6 via an insulative underlying film such as an oxide film 41, for example, a gate oxide film.

An insulating film 15 which acts as a sidewall is formed on the peripheral walls (the whole walls) of the n- and p-type polysilicons 2,3.

An interlayer insulating film 42 is formed on the silicide layer 4, the n-type polysilicon 2 and the p-type polysilicon 3.

In the interlayer insulating film 42, contacts 7 and 8 are formed in the areas corresponding to the n- and p-type polysilicons 2 and 3, respectively, each of which is connected to the silicide layer 4.

On the interlayer insulating film 42, a first interconnection layer 43 and a second interconnection layer 44 are formed. The first interconnection layer 43 is electrically connected with the n-type polysilicon 2 via the contact 7 while the second interconnection layer 44 is electrically connected with the p-type polysilicon 3 via the contact 8. The first and the second interconnection layers 43,44 may be, for example, made of a metal such as aluminum.

As described above, in this embodiment, the contact 7 is formed in the area over n-type polysilicon 2 except the area where the silicide layer 4 is formed. The contact 8 is also formed in the area over the p-type polysilicon 3 except the area where the silicide layer 4 is formed.

There will be described a process for manufacturing a semiconductor device 1.

Figure 2:
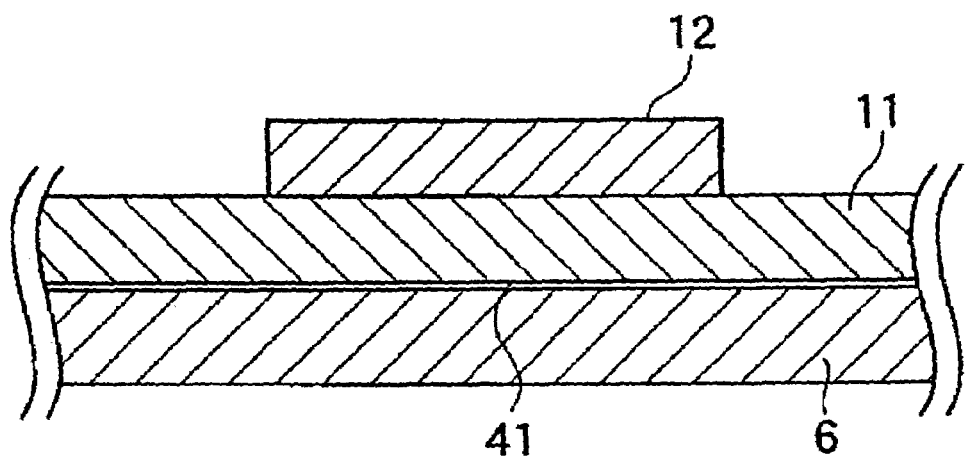
FIG. 2 is an elevational view in sections illustrating a process for manufacturing the semiconductor device in FIGS. 1A and 1B.

First, as shown in FIG. 2, on an oxide film 41 ($SiO_2$ film) on a semiconductor substrate as a base film 6 is deposited by, for example, vapor deposition a polysilicon 11, on which is then formed a photoresist mask 12 over the areas where an n- and a p-type polysilicons 2,3 will be formed. The semiconductor substrate is, for example, a silicon substrate.

Figure 3:
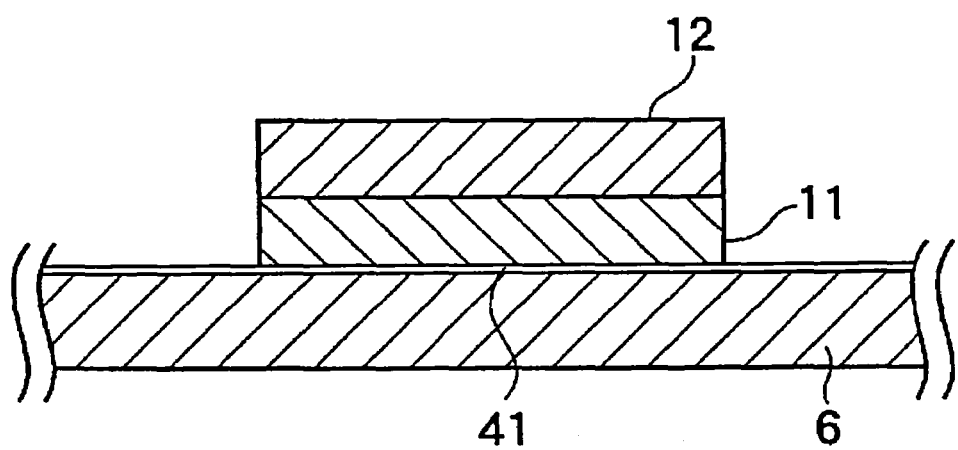
FIG. 3 is an elevational view in sections illustrating a process for manufacturing the semiconductor device in FIGS. 1A and 1B.

Then, the polysilicon 11 exposed from the photoresist mask 12 is etched off to give the structure shown in FIG. 3.

Figure 4:
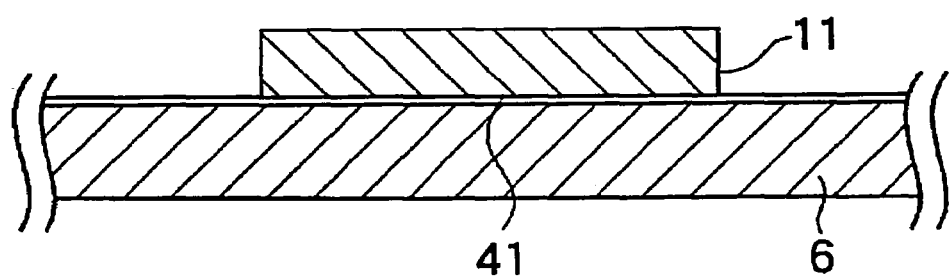
FIG. 4 is an elevational view in sections illustrating a process for manufacturing the semiconductor device in FIGS. 1A and 1B.

Next, the photoresist mask 12 is removed to give the structure shown in FIG. 4.

Figure 5:
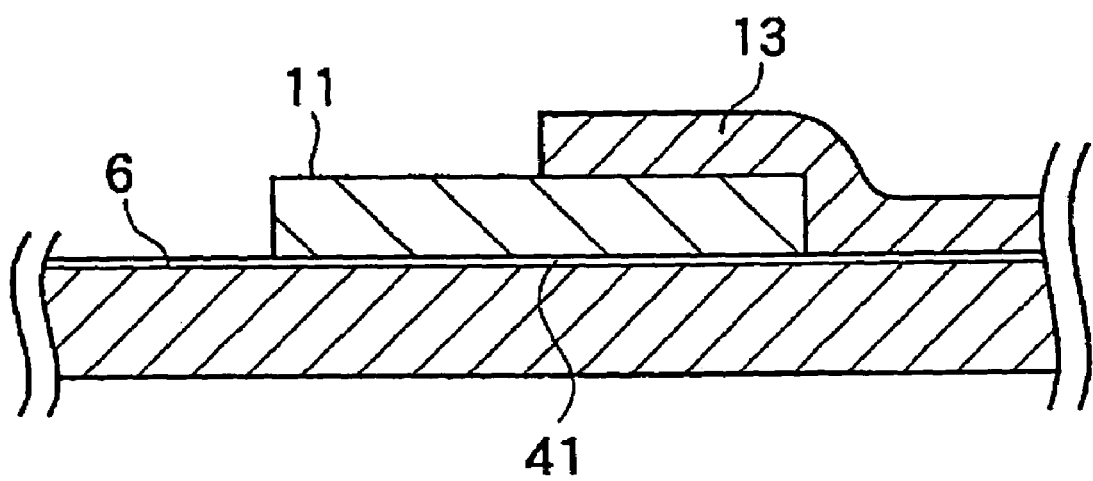
FIG. 5 is an elevational view in sections illustrating a process for manufacturing the semiconductor device in FIGS. 1A and 1B.
Figure 6:
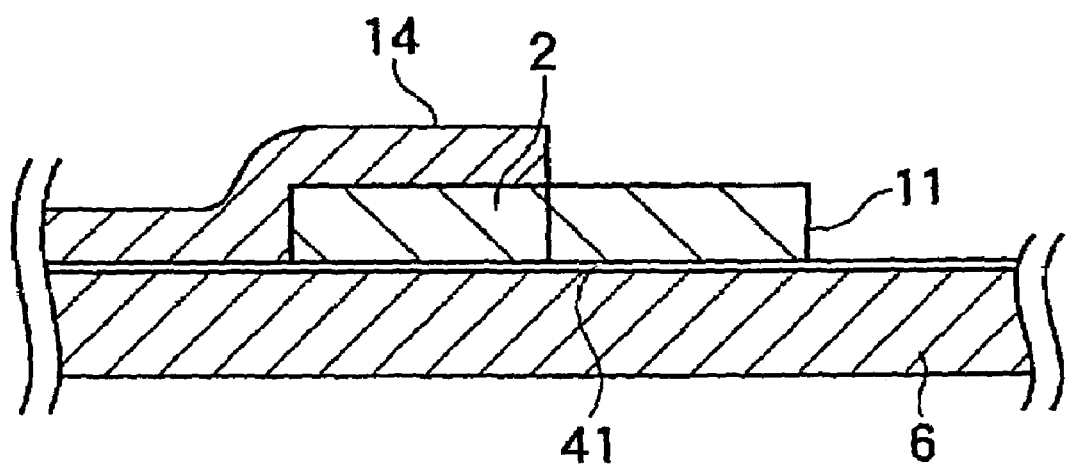
FIG. 6 is an elevational view in sections illustrating a process for manufacturing the semiconductor device in FIGS. 1A and 1B.

Then, as shown in FIG. 5, for example, a photoresist mask 13 is formed on the area in the polysilicon 11 which will be a p-type polysilicon 3, and then the area exposed from the photoresist mask 13, that is, the area to be an n-type polysilicon 2, is doped with a dopant by ion implantation to be an n-type polysilicon 2 (FIG. 6).

Figure 7:
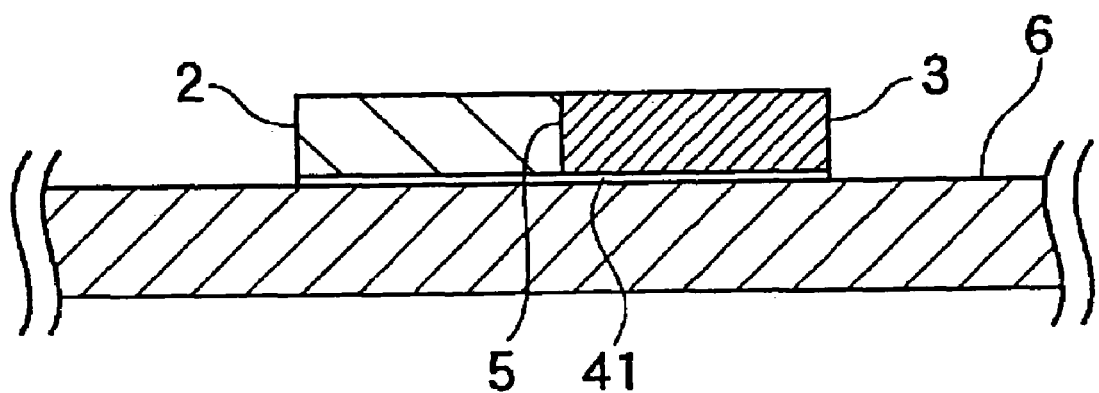
FIG. 7 is an elevational view in sections illustrating a process for manufacturing the semiconductor device in FIGS. 1A and 1B.

Then, after removing the photoresist mask 13, a photoresist mask 14 is formed only over the area as the n-type polysilicon 2 in the polysilicon 11 as shown in FIG. 6, and then the area exposed from the photoresist mask 14, that is, the area to be a p-type polysilicon 3, is doped with a dopant by ion implantation to be a p-type polysilicon 3 (FIG. 7).

Next, the oxide film 41 exposed from the photoresist mask 14 and both polysilicons 2,3 is removed to give the structure shown in FIG. 7.

The order of forming the n-type polysilicon 2 and the p-type polysilicon 3 is not crucial. The oxide film 41 exposed from both polysilicon 2,3 may be removed by the procedure shown in FIG. 3.

Figure 8:
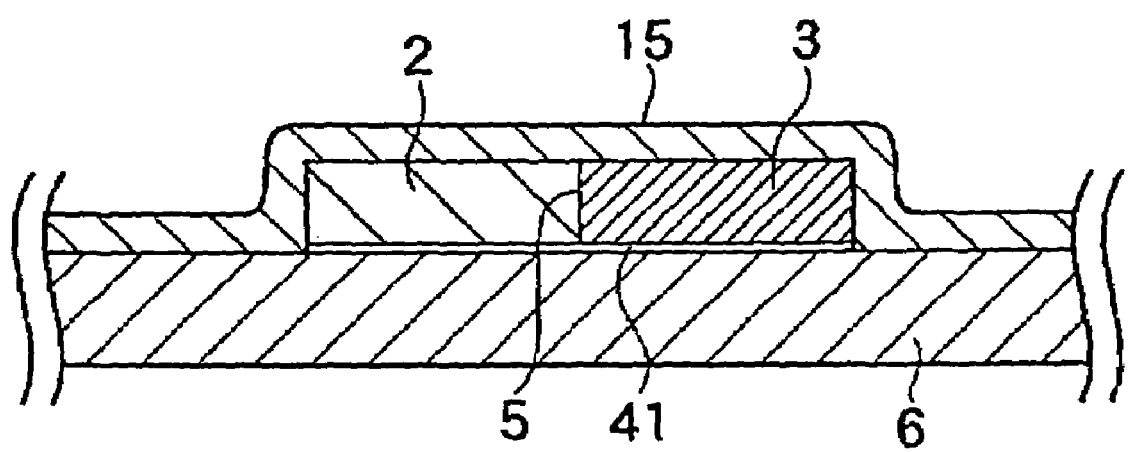
FIG. 8 is an elevational view in sections illustrating a process for manufacturing the semiconductor device in FIGS. 1A and 1B.

Then, as shown in FIG. 8, an acid resistant insulating film 15 is deposited on the n-type polysilicon 2, the p-type polysilicon 3 and the base film 6.

Figure 9:
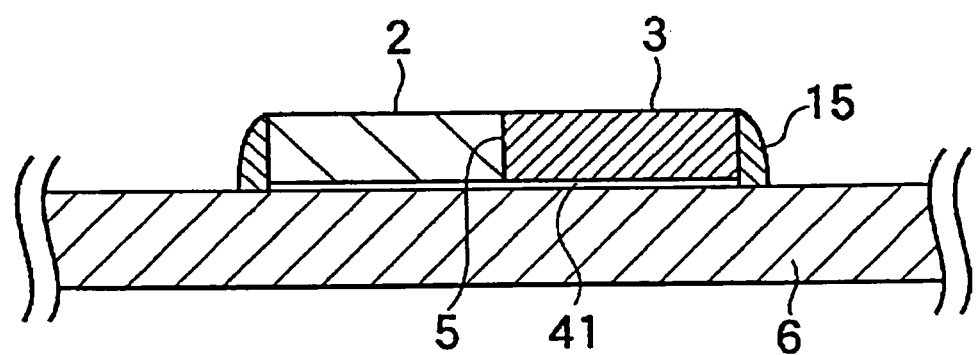
FIG. 9 is an elevational view in sections illustrating a process for manufacturing the semiconductor device in FIGS. 1A and 1B.

Then, the insulating film 15 is removed by, for example, wet etching. During the etching, an etchant does not fully reach the peripheral walls of the n- and p-type polysilicons 2,3, and consequently, the insulating film 15 remains in the peripheral walls as shown in FIG. 9. The insulating film 15 formed only on the peripheral walls of the n- and the p-type polysilicons 2,3 (the whole walls) is called a sidewall, which is effective for preventing a leak current.

Figure 10:
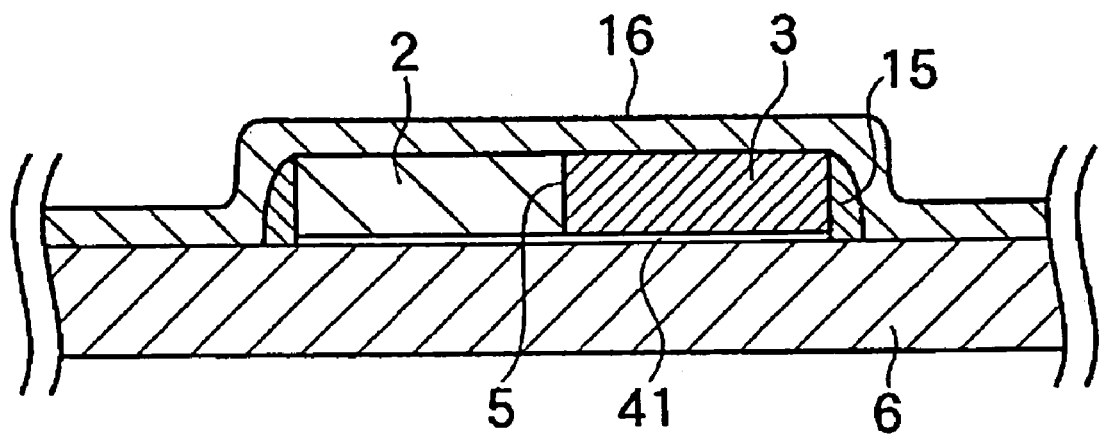
FIG. 10 is an elevational view in sections illustrating a process for manufacturing the semiconductor device in FIGS. 1A and 1B.

Then, as shown in FIG. 10, an insulating film 16 (an oxide film) which can be etched with an acid is deposited on the n-type polysilicon 2, the p-type polysilicon 3, the base film 6 and the insulating film 15.

Figure 11:
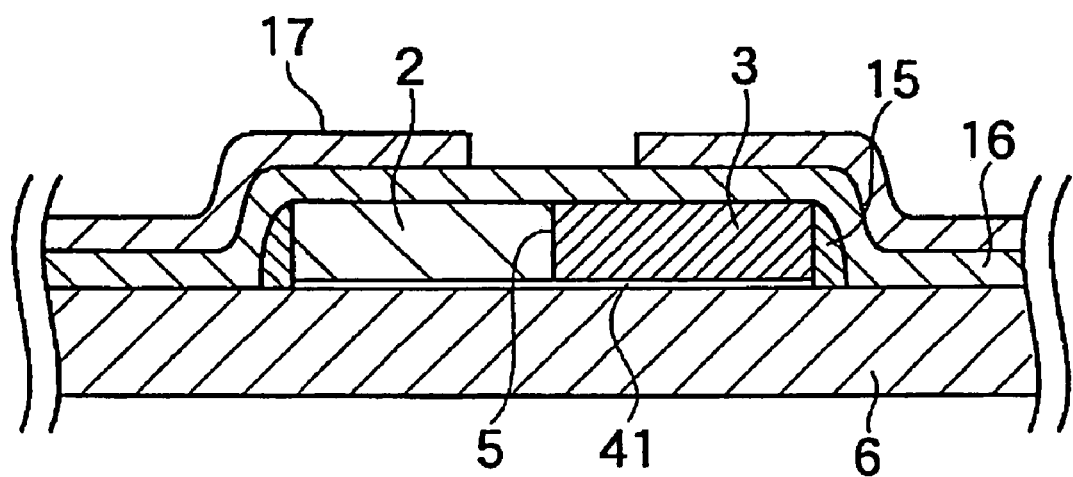
FIG. 11 is an elevational view in sections illustrating a process for manufacturing the semiconductor device in FIGS. 1A and 1B.

Then, as shown in FIG. 11, a photoresist mask 17 is formed over the area in the insulating film 16 except the area where a silicide layer 4 is to be formed.

The pattern of the photoresist mask 17 is such that the mask covers the whole periphery of the upper surface of the polysilicon 11 while, inside of the periphery, forming an opening in the border 5 of the upper surface of the polysilicon 11 and its neighboring area.

Figure 12:
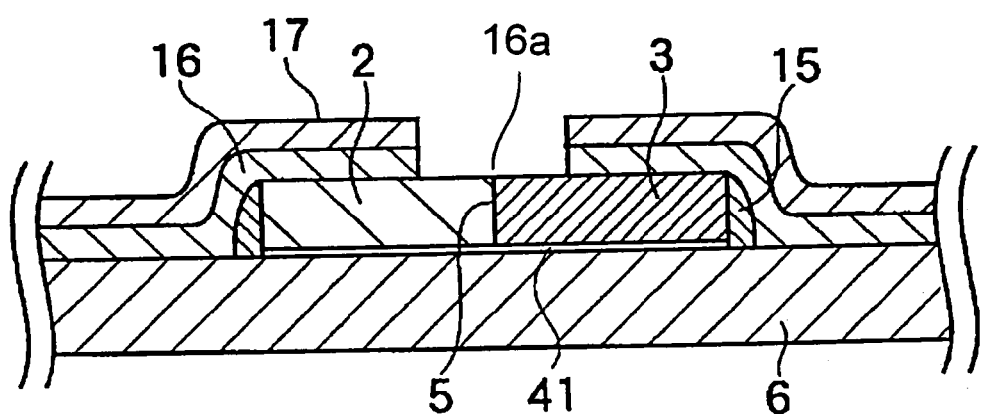
FIG. 12 is an elevational view in sections illustrating a process for manufacturing the semiconductor device in FIGS. 1A and 1B.

Then, the insulating film 16 with the photoresist mask 17 is etched with an acid to form an opening 16a for forming a silicide layer 4 in the insulating film 16 (FIG. 12).

Figure 13:
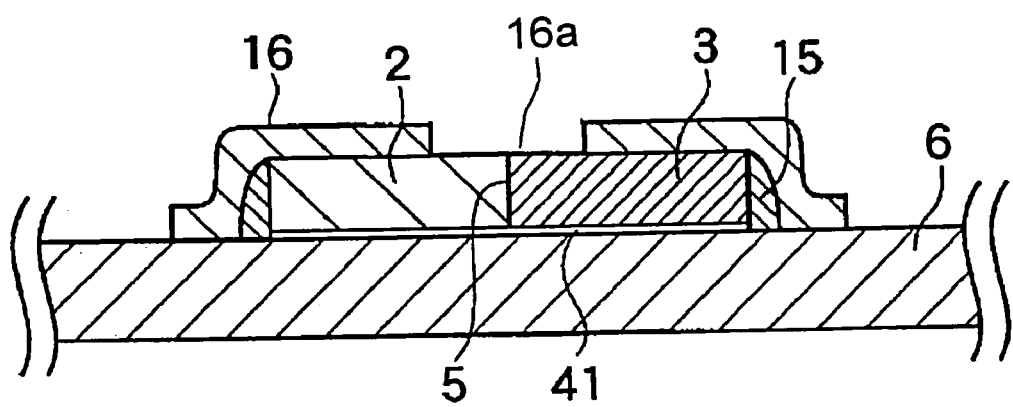
FIG. 13 is an elevational view in sections illustrating a process for manufacturing the semiconductor device in FIGS. 1A and 1B.

Next, the photoresist mask 17 is removed to give the structure shown in FIG. 13, where the insulating film 16 acts as a mask for forming a silicide layer 4.

Figure 14:
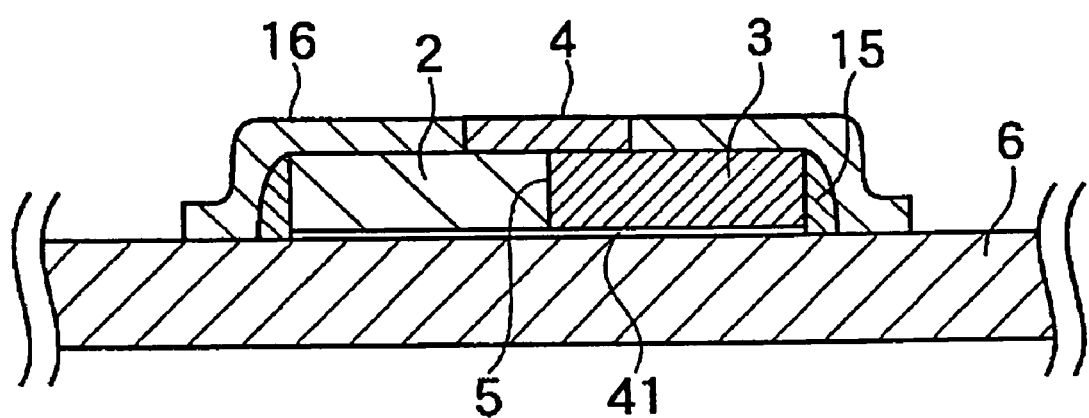
FIG. 14 is an elevational view in sections illustrating a process for manufacturing the semiconductor device in FIGS. 1A and 1B.

Then, using the insulating film 16 as a mask, a metal layer made of a high melting metal such as Co is deposited by sputtering via the opening 16a in the area where a silicide layer 4 is to be formed. Then, the product is silicided by heating in the atmosphere of nitrogen to form a silicide layer 4 as shown in FIG. 14. The metal layer is formed over the whole upper surface of the substrate by sputtering, but the metal layer in the area except the silicide layer 4 is not silicided so that it is removed by washing after heating.

Thus, the silicide layer 4 is formed only over the border 5 and its neighboring area between the n- and p-type polysilicons 2,3.

Figure 15:
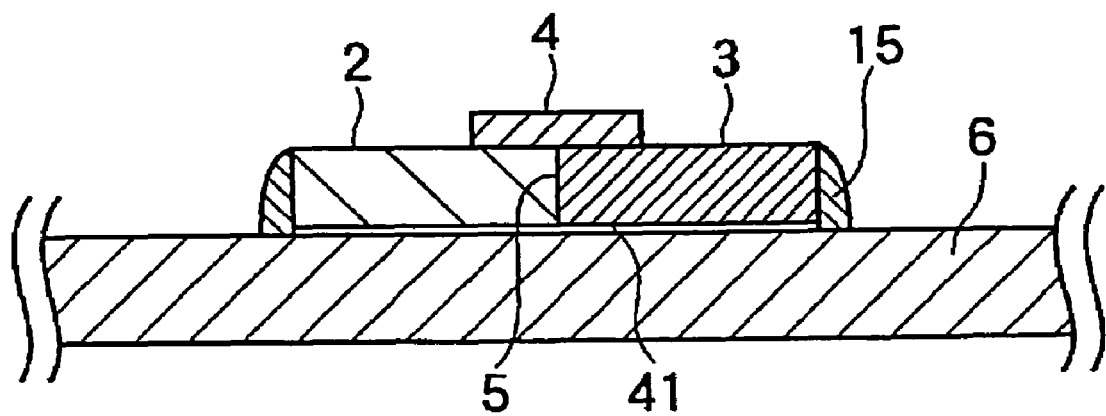
FIG. 15 is an elevational view in sections illustrating a process for manufacturing the semiconductor device in FIGS. 1A and 1B.

Then, the insulating film 16 is removed by etching with an acid to give the structure shown in FIG. 15. The insulating film 15 which acts as a sidewall remains after the etching because it is acid-resistant.

Next, as shown in FIG. 1B, an interlayer insulating film 42 is deposited over the silicide layer 4, the n-type polysilicon 2 and the p-type polysilicon 3. In the interlayer insulating film 42, contacts 7 and 8 are formed in the areas corresponding to the n-type polysilicon 2 and the p-type polysilicon 3, respectively, each of which is connected to the silicide layer 4. The contacts 7 and 8 are, for example, plugs formed by conducting films such as metal films. On the interlayer insulating film 42, a first interconnection layer 43 is formed in the area covering the contact 7 while a second interconnection layer 44 is formed in the area covering the contact 8. Thus, the first interconnection layer 43 is electrically connected to the n-type polysilicon 2 via the contact 7, while the second interconnection layer 44 is electrically connected to the p-type polysilicon 3 via the contact 8.

Following the process described above, a semiconductor device 1 can be manufactured.

According to Embodiment 1 described above, the semiconductor device 1 comprises the silicide layer 4 extending from the n-type polysilicon 2 to the p-type polysilicon 3, so that a resistance between the n-type polysilicon 2 and the p-type polysilicon 3 can be reduced. The polysilicons 2,3 may be, therefore, equipotential.

Furthermore, since the silicide layer 4 is formed over the area in the upper surfaces of the n- and the p-type polysilicons 2,3 except their peripheries, a leak current between the silicide layer 4 and another part via the sides of the polysilicons 2,3 can be suitably prevented.

In the semiconductor device 1 according to Embodiment 1, the n-type polysilicon 2 is, for example, an n-gate (gate electrode), while the p-type polysilicon 3 is, for example, a p-gate (gate electrode).

Figure 18:
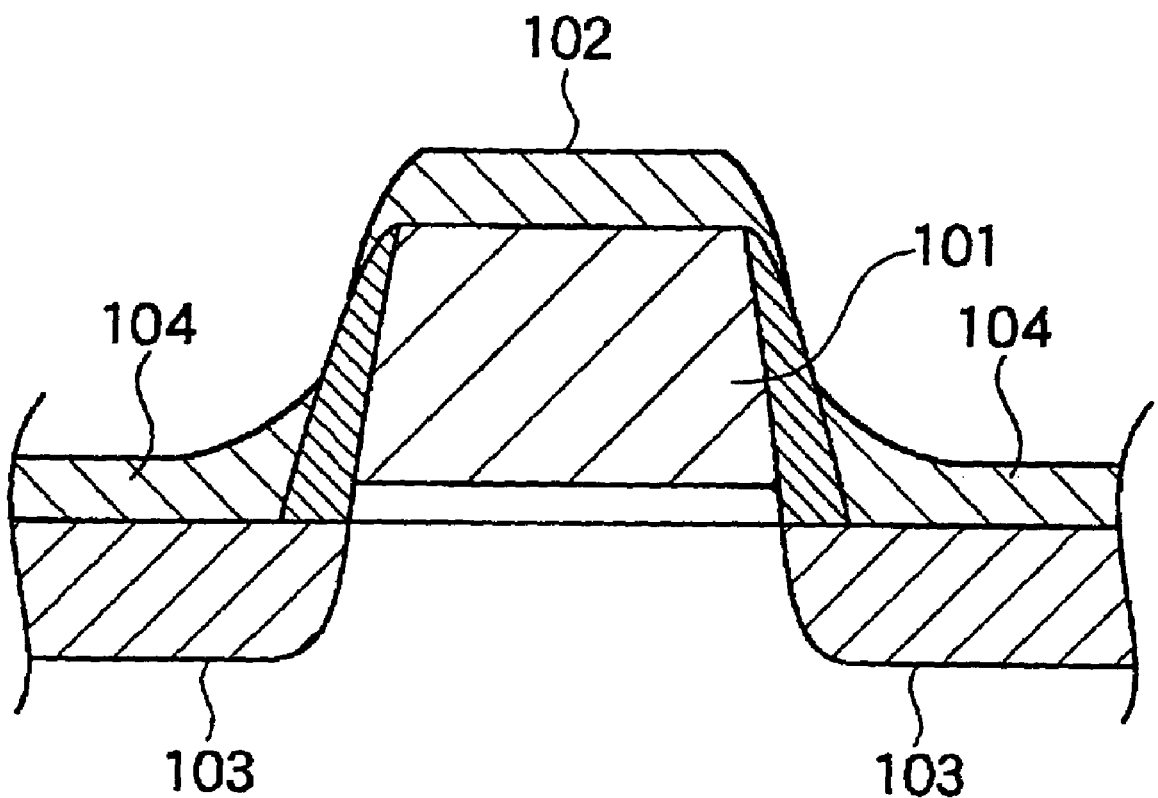
FIG. 18 illustrates a configuration of a semiconductor device according to the related art.

The semiconductor device 1 according to Embodiment 1 may be suitably applied to a cell in, for example, a DRAM (Dynamic Random Access Memory) or a nonvolatile memory. It can suitably prevent a leak current from the silicide layer 4 on the n- and the p-type polysilicons 2,3 to a diffusion layer (See FIG. 18).

Figure 19:
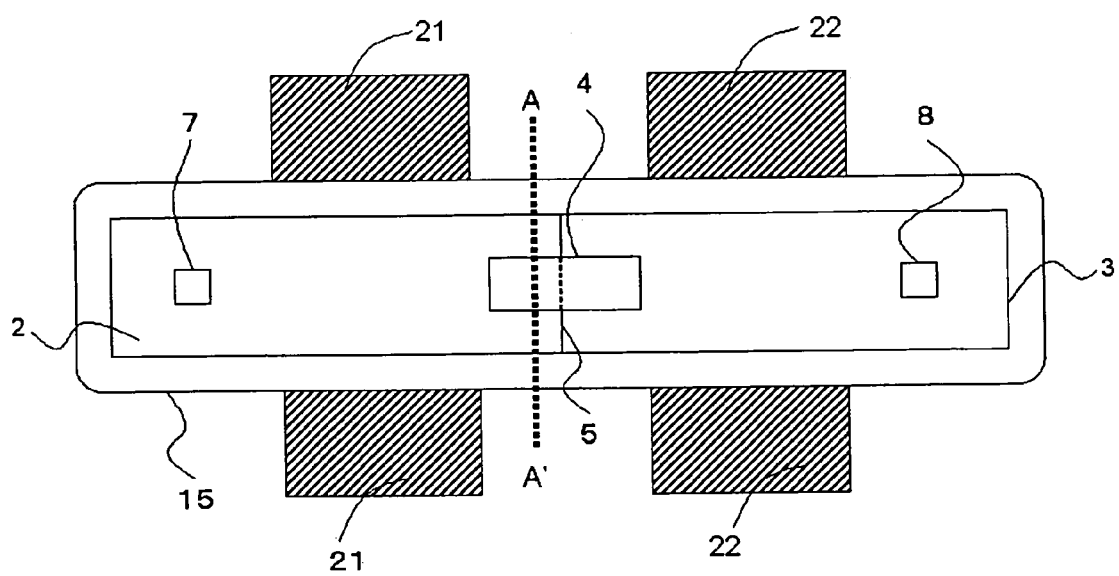
FIG. 19 is a plan view showing a configuration of a semiconductor device according to an embodiment of this invention.
Figure 20:
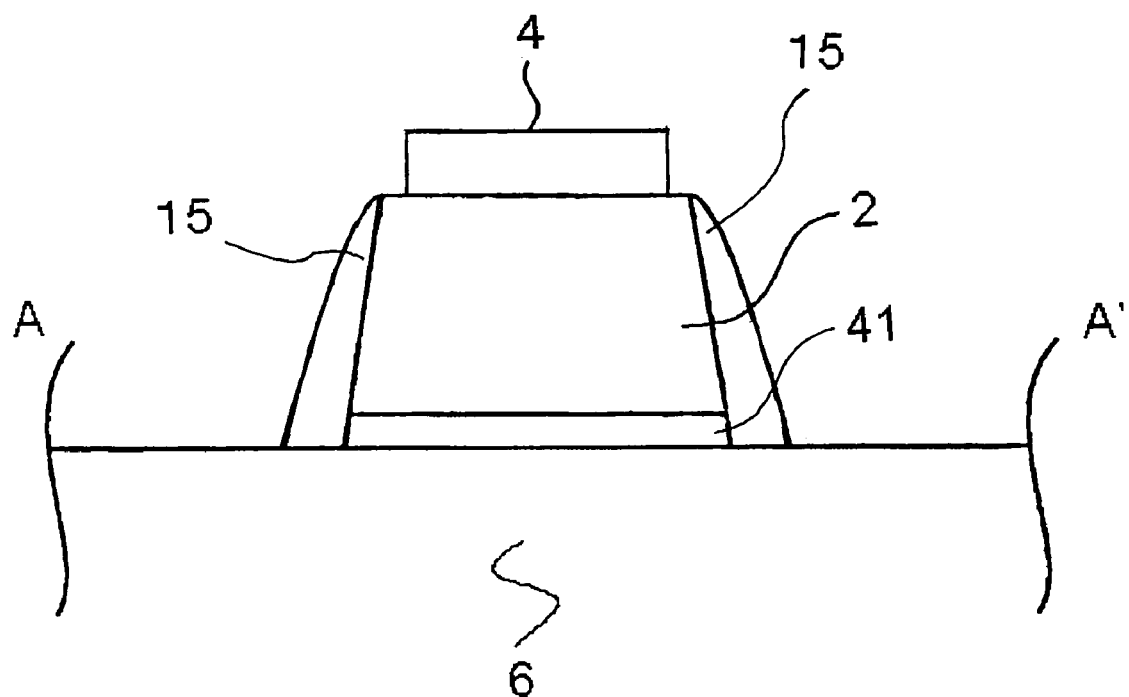
FIG. 20 is a cross-sectional view taken on line A-A' of FIG. 19.

For example, when applying the configuration in FIGS. 1A and 1B to a cell in a semiconductor device comprising a DRAM, the structure shown in FIGS. 19 and 20 may be employed. FIG. 19 is a plan view illustrating the configuration of a semiconductor device comprising a DRAM. FIG. 20 is a cross-sectional view taken on line A-A' of FIG. 19. In addition to the configuration in FIGS. 1A and 1B, the semiconductor device shown in FIGS. 19 and 20 comprises a source-drain region 21 in the base film 6 (semiconductor substrate) in the side of the n-type polysilicon 2 and a source-drain region 22 in the semiconductor substrate in the side of the p-type polysilicon 3. Each of the contacts 7 and 8 is electrically connected to a capacitative element (not shown). The contacts may be connected to the capacitative element via the first interconnection layer 43 or the second interconnection layer 44 shown in FIG. 1B, or without such an interconnection layer.

As shown in FIG. 20, the silicide layer 4 is selectively formed over the upper surfaces of the n- and p-type polysilicons 2,3, so that a resistance between the n-type polysilicon 2 and the p-type polysilicon 3 may be reduced while preventing a leak current from the silicide layer 4 to the semiconductor substrate via the side of the insulating film 15.

Besides a cell, the configuration of the semiconductor device 1 can be suitably applied to, for example, a transistor having a dual gate structure. Specifically, it can be applied to a transistor mounted in a logic in a semiconductor device having both memory cell and logic circuit.

Embodiment 2

Embodiment 2 illustrates a manufacturing process useful when it is difficult to form a silicide layer 4 because an n- and a p-type polysilicons 2,3 are narrow, as well as a related semiconductor device.

Specifically, in a semiconductor device 20 according to Embodiment 2, both n- and p-type polysilicons 2,3 are preliminarily (before forming the silicide layer 4) formed such that in these polysilicons, the area where the silicide layer 4 is to be formed and its neighboring area are broader than the surrounding area thereof, that is, a narrow area.

Thus, even when the surrounding area except the area where a silicide layer 4 is to be formed and its neighboring is narrow, the silicide layer 4 can be more suitably formed because the border 5 and its neighboring area are broader in a direction vertical to the direction of extension of the n- and p-type polysilicon 2,3.

Figure 16:
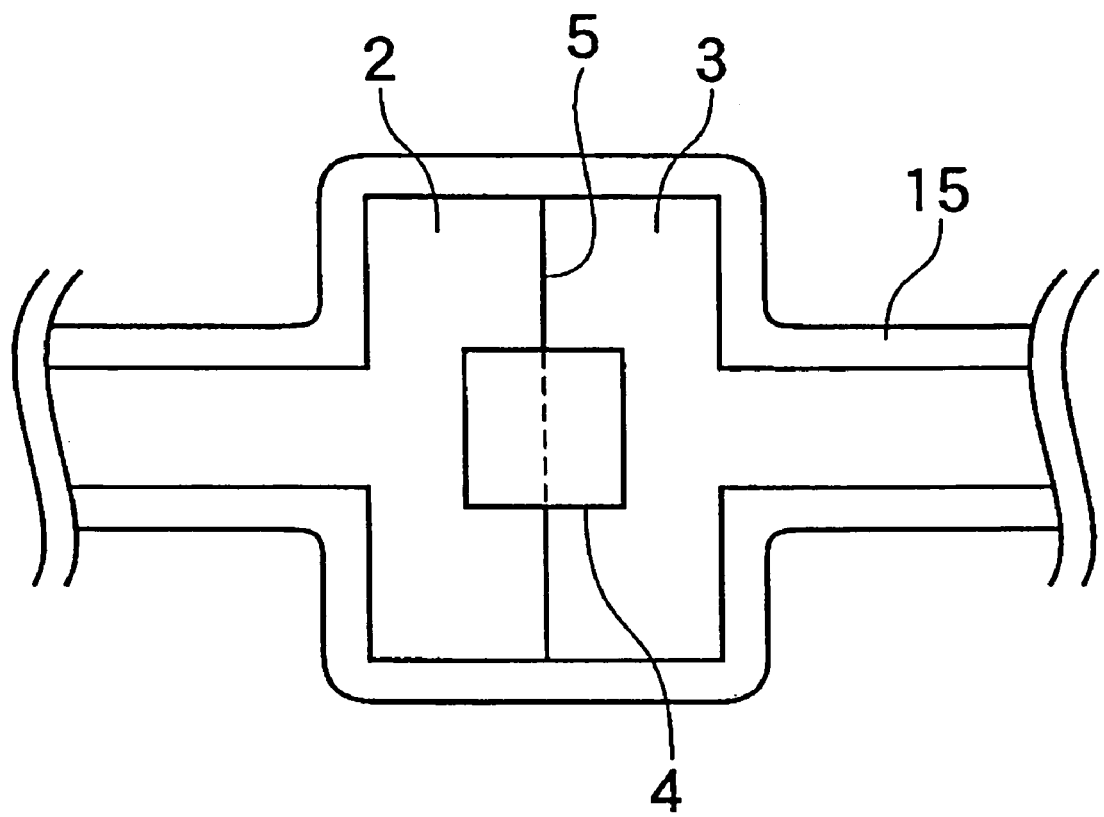
FIG. 16 is a plan view showing a configuration of a semiconductor device according to an embodiment of this invention.

In FIG. 16, the interlayer insulating film 42 is not shown.

In addition to advantages of Embodiment 1, Embodiment 2 has an additional advantage that the silicide layer 4 can be suitably formed even when the area except the area where the silicide layer 4 is to be formed and its neighboring area is narrow in the n- and p-type polysilicons 2,3.

Therefore, for example, when a semiconductor device according to Embodiment 1 is applied to the cell in a semiconductor device having a DRAM described in Embodiment 1 and a source-drain region is formed in the lower side of the area where the silicide layer 4 is to be formed, it can prevent a leak current from the silicide layer 4 to the source-drain region via the side of the insulating film 15.

Embodiment 3

Figure 17A:
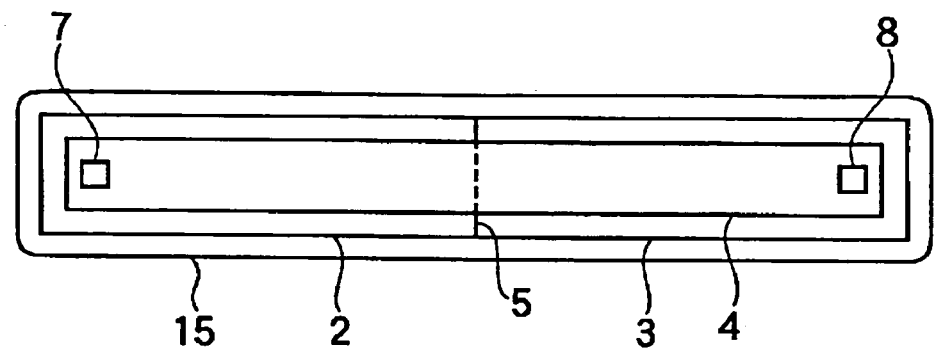
FIG. 17A is a plan view showing a configuration of a semiconductor device according to an embodiment of this invention.
Figure 17B:
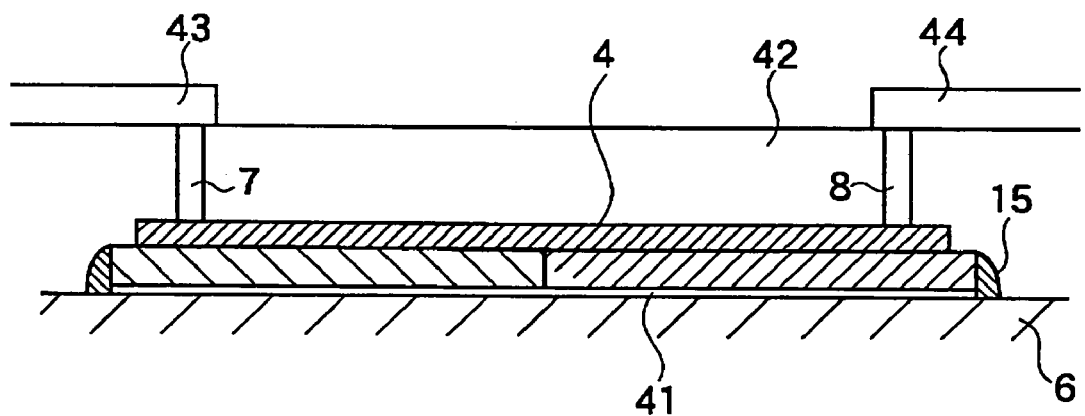
FIG. 17B is an elevational view in section showing a configuration of a semiconductor device according to an embodiment of this invention.

FIG. 17A is a schematic plan view showing a semiconductor device 30 according to Embodiment 3 of this invention and FIG. 17B is an elevational view in section thereof. In FIG. 17A, an interlayer insulating film 42, a first interconnection layer 43 and a second interconnection layer 44 are not shown.

As shown in FIGS. 17A and 17B, in the semiconductor device 30 according to Embodiment 3, an interlayer insulating film 42 has a contact 7 in the area corresponding to an n-type polysilicon 2 and a contact 8 in the area corresponding to a p-type polysilicon 3, each of which is connected to the silicide layer 4.

For this purpose, as shown in FIGS. 17A and 17B, it is preferable to preliminarily form a silicide layer 4 such that in comparison with FIG. 1, it is broader in a direction different from the extension direction of the border 5, specifically a direction perpendicular to the extension direction of the border 5.

In addition to advantages of Embodiment 1, Embodiment 3 has an additional advantage that the contact 7 and the contact 8 can be electrically interconnected via the silicide layer 4.

It is apparent that the present invention is not limited to the above embodiment, that may be modified and changed without departing from the scope and spirit of the invention.

What is claimed is:

1. A semiconductor device comprising:
   neighboring n- and p-type polysilicons; and
   a silicide layer thereon extending from said n-type polysilicon to said p-type polysilicon,
   wherein said silicide layer is formed over upper surfaces of said n- and p-type polysilicons except a periphery thereof.

2. A semiconductor device comprising:
   neighboring n- and p-type polysilicons; and
   a silicide layer thereon extending from said n-type polysilicon to said p-type polysilicon,
   wherein said silicide layer is formed on a border region of said n- and p- type polysilicons without contacting any edges of said n- and p-type polysilicons.

3. The semiconductor device according to claim 1, wherein said silicide layer is formed only in a border and its neighboring area between said n- and said p-type polysilicons.

4. The semiconductor device according to claim 2, wherein said silicide layer is formed only in a border and its neighboring area between said n- and p-type polysilicons.

5. The semiconductor device according to claim 3, wherein in said n- and p-type polysilicons, a region on which said silicide layer is to be formed and its neighboring area are broader than a surrounding area.

6. The semiconductor device according to claim 4, wherein in said n- and p-type polysilicons, a region on which said silicide layer is to be formed and its neighboring area are broader than a surrounding area.

7. The semiconductor device according to claim 1, further comprising an interlayer insulating film over said silicide layer and said n- and said p-type polysilicons,
   wherein said interlayer insulating film have a first and a second contacts in areas corresponding to said n- and said p-type polysilicons, respectively, each of which is connected to said silicide layer.

8. The semiconductor device according to claim 2, further comprising an interlayer insulating film over said silicide layer and said n- and said p-type polysilicons,
   wherein said interlayer insulating film have a first and a second contacts in areas corresponding to said n- and said p-type polysilicons, respectively, each of which is connected to said silicide layer.

9. The semiconductor device according to claim 1, wherein said n-type polysilicon acts as an n-gate while said p-type polysilicon acts as a p-gate.

10. The semiconductor device according to claim 2, wherein said n-type polysilicon acts as an n-gate while said p-type polysilicon acts as a p-gate.

11. The semiconductor device according to claim 9, wherein said semiconductor device comprises at least a DRAM, whose cell comprises said n- and said p-gates and said silicide layer.

12. The semiconductor device according to claim 10, wherein said semiconductor device comprises at least a DRAM, whose cell comprises said n- and said p-gates and said silicide layer.

13. The semiconductor device according to claim 9, wherein said semiconductor device comprises at least a non-volatile memory, whose cell comprises said n- and said p-gates and said silicide layer.

14. The semiconductor device according to claim 10, wherein said semiconductor device comprises at least a non-volatile memory, whose cell comprises said n- and said p-gates and said silicide layer.

15. A process for manufacturing a semiconductor device comprising:
   forming neighboring n- and p-type polysilicons; and
   forming a silicide layer extending from said n-type polysilicon to said p-type polysilicon, said silicide layer being formed on a border region of said n- and p-type polysilicons without contacting any edges of said n- and p-type polysilicons.

16. The process for manufacturing a semiconductor device according to claim 15, wherein said forming a silicide layer comprises
   forming a mask over said upper surface of said polysilicons which covers said periphery of said upper surface and has an opening around a border between said n- and said p-type polysilicons;
   then forming a metal layer over a whole upper surfaces of said n- and said p-type polysilicons; and
   siliciding at least part of said metal layer.

17. The process for manufacturing a semiconductor device according to claim 15, wherein in said forming a silicide layer, said silicide layer is formed only in said border and its neighboring area between said n- and said p-type polysilicons.

18. The process for manufacturing a semiconductor device according to claim 17, wherein in said forming polysilicons, said n- and p-type polysilicons are formed such that a region on which said silicide layer is to be formed and its neighboring area is broader than a surrounding area.

19. The process for manufacturing a semiconductor device according to claim 15, further comprising:
   forming an interlayer insulating film over said silicide layer and said n- and said p-type polysilicons; and
   forming in said interlayer insulating film a first and a second contacts corresponding to said n- and said p-type polysilicons, respectively, each of which is connected to said silicide layer.

20. The semiconductor device according to claim 1, wherein said silicide layer electrically connects said n- and p-type polysilicons.

\* \* \* \* \*